(12) United States Patent
Rinner et al.

(10) Patent No.: US 9,825,215 B2
(45) Date of Patent: *Nov. 21, 2017

(54) METHOD OF FORMING A PIEZOELECTRIC ACTUATOR

(71) Applicant: EPCOS AG, Munich (DE)

(72) Inventors: Franz Rinner, Deutschlandsberg (AT); Dieter Somitsch, Gross St. Florian (AT); Jan-Thorsten Reszat, Karlsruhe (DE); Reinhard Gabl, Kufstein (AT); Martin Galler, Kalsdorf (AT); Christoph Auer, Graz (AT); Georg Kuegerl, Eibiswald (AT)

(73) Assignee: EPCOS AG, Munich (DE)

( * ) Notice: Subject to any disclaimer, the term of this patent is extended or adjusted under 35 U.S.C. 154(b) by 271 days.

This patent is subject to a terminal disclaimer.

(21) Appl. No.: 14/706,728

(22) Filed: May 7, 2015

(65) Prior Publication Data
US 2015/0243880 A1 Aug. 27, 2015

Related U.S. Application Data

(63) Continuation of application No. 13/128,669, filed as application No. PCT/EP2009/065009 on Nov. 11, 2009, now Pat. No. 9,059,392.

(30) Foreign Application Priority Data

Nov. 11, 2008 (DE) ........................ 10 2008 056 746

(51) Int. Cl.
*H04R 17/00* (2006.01)
*H01L 41/313* (2013.01)
(Continued)

(52) U.S. Cl.
CPC .............. *H01L 41/313* (2013.01); *C23C 4/02* (2013.01); *C23C 4/08* (2013.01); *C23C 4/12* (2013.01);
(Continued)

(58) Field of Classification Search
CPC ... H01L 41/0472; H01L 41/083; H01L 41/29; H01L 41/293; H01L 41/311;
(Continued)

(56) References Cited

U.S. PATENT DOCUMENTS 5,075,665 A * 12/1991 Taira ...................... H01C 7/102
338/21
6,157,289 A * 12/2000 Kojima ................... H01C 7/021
338/22 R
(Continued)

FOREIGN PATENT DOCUMENTS

DE 19913271 A1 9/2000
DE 10225408 A1 12/2003
(Continued)

*Primary Examiner* — Paul D Kim
(74) *Attorney, Agent, or Firm* — Slater Matsil, LLP

(57) ABSTRACT

A piezoelectric actuator of a multilayer design includes outer electrodes that are fastened by means of a bonding layer applied by thermal spraying. For example, the outer electrodes are formed as a woven wire fabric. Furthermore, a method for fastening an outer electrode in a piezoelectric actuator is specified.

19 Claims, 2 Drawing Sheets

(51) Int. Cl.
  *H01L 41/29* (2013.01)
  *H01L 41/047* (2006.01)
  *C23C 4/02* (2006.01)
  *C23C 4/08* (2016.01)
  *C23C 4/12* (2016.01)
  *H01L 41/293* (2013.01)
  *H01L 41/311* (2013.01)
  *C23C 4/131* (2016.01)
  *C23C 4/129* (2016.01)
  *C23C 4/134* (2016.01)
  *H01L 41/083* (2006.01)

(52) U.S. Cl.
  CPC .............. *C23C 4/129* (2016.01); *C23C 4/131* (2016.01); *C23C 4/134* (2016.01); *H01L 41/0472* (2013.01); *H01L 41/29* (2013.01); *H01L 41/293* (2013.01); *H01L 41/311* (2013.01); *H01L 41/083* (2013.01); *Y10T 29/42* (2015.01); *Y10T 156/10* (2015.01)

(58) Field of Classification Search
  CPC ......... H01L 41/313; C23C 4/02; C23C 4/134; C23C 4/12; C23C 4/08; C23C 4/131; C23C 4/129
  See application file for complete search history.

(56) References Cited

U.S. PATENT DOCUMENTS

| | | | | |
|---|---|---|---|---|
| 6,172,591 | B1* | 1/2001 | Barrett | H01C 7/027 338/22 R |
| 6,188,308 | B1* | 2/2001 | Kojima | H01C 7/028 338/22 R |
| 6,208,026 | B1 | 3/2001 | Bindig et al. | |
| 6,236,302 | B1* | 5/2001 | Barrett | H01C 1/1406 338/22 R |
| 6,573,639 | B1 | 6/2003 | Heinz et al. | |
| 6,593,844 | B1* | 7/2003 | Iwao | H01C 1/1406 338/22 R |
| 7,075,408 | B2* | 7/2006 | Mihara | H01C 7/021 338/204 |
| 8,258,677 | B2* | 9/2012 | Denneler | H01L 41/0472 310/328 |
| 8,410,671 | B2* | 4/2013 | Adachi | H01L 41/0913 310/366 |
| 2002/0043901 | A1 | 4/2002 | Kihara et al. | |
| 2002/0084350 | A1 | 7/2002 | Kwazoe et al. | |
| 2002/0144836 | A1* | 10/2002 | Hunn | B64C 1/38 174/102 SC |
| 2006/0232172 | A1 | 10/2006 | Asano et al. | |
| 2007/0164639 | A1 | 7/2007 | Ohmori et al. | |

FOREIGN PATENT DOCUMENTS

| | | |
|---|---|---|
| DE | 102006019900 A1 | 11/2007 |
| EP | 0675365 A2 | 10/1995 |
| EP | 0844678 A1 | 5/1998 |
| EP | 1701391 A1 | 9/2006 |
| EP | 1780813 A1 | 5/2007 |
| EP | 1814169 A2 | 8/2007 |
| EP | 2043170 A2 | 4/2009 |
| JP | H3270283 A | 12/1991 |
| JP | 2005322691 A | 11/2005 |
| WO | 0057497 A1 | 9/2000 |
| WO | 2006073024 A1 | 7/2006 |

* cited by examiner

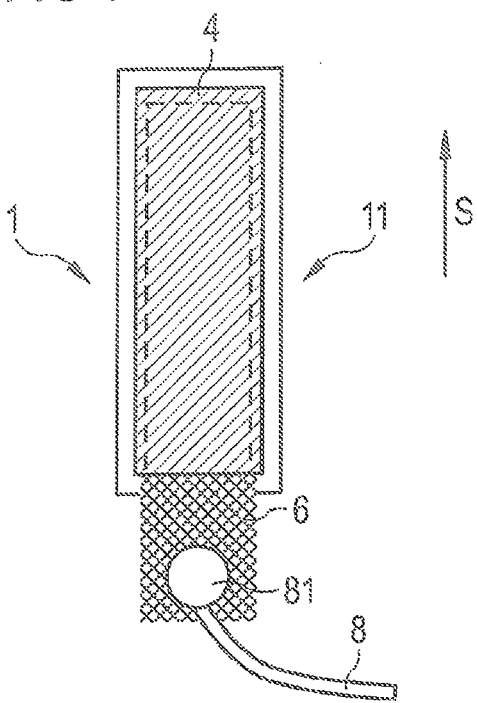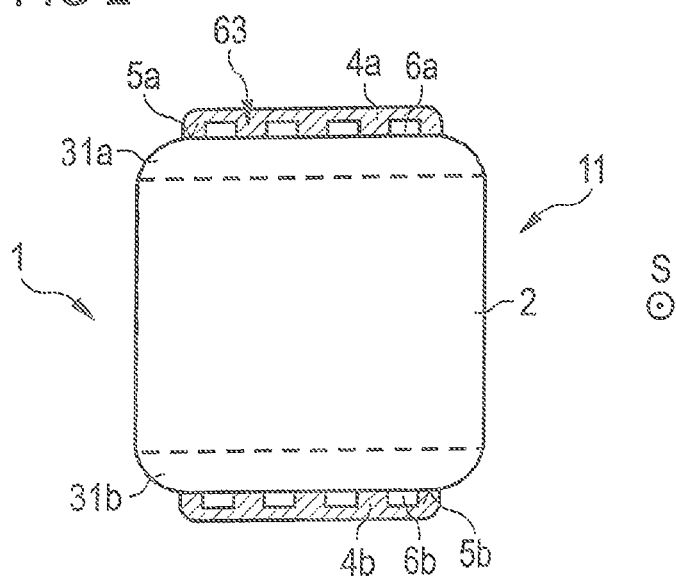

METHOD OF FORMING A PIEZOELECTRIC ACTUATOR

This patent application is a continuation of, and claims the benefit of, U.S. patent application Ser. No. 13/128,669, filed on May 11, 2011, titled "Piezoelectric Actuator of a Multi-layer Design and Method for Fastening an Outer Electrode in a Piezoelectric Actuator," which is a national phase filing under section 371 of PCT/EP2009/065009, filed Nov. 11, 2009, which claims the priority of German patent application 10 2008 056 746.9, filed Nov. 11, 2008, each of which are incorporated herein by reference in their entirety.

BACKGROUND

A piezoelectric actuator of a multilayer design in which piezoelectric layers and electrode layers are arranged in a stack is specified. For the electrical contacting of the electrode layers, outer electrodes are fastened to outer sides of the stack. Piezoelectric actuators of this type are used, for example, for actuating an injection valve in a motor vehicle.

European patent 0844678 B1 describes a piezoelectric actuator with an outer electrode fastened to the stack.

SUMMARY OF THE INVENTION

In one aspect, the present invention discloses connecting an outer electrode to the stack of piezoelectric layers and electrode layers with as little detrimental effect as possible.

A piezoelectric actuator of a multilayer design with a stack of piezoelectric layers and electrode layers arranged in between is specified. The piezoelectric actuator has at least one outer electrode, which is fastened to an outer side of the stack by means of a layer applied by thermal spraying.

Preferably, all the layers of the stack are sintered at one and the same time and form a monolithic multilayer actuator. Thin sheets which contain a piezoelectric material such as lead-zirconate-titanate (PZT) are used, for example, for the piezoelectric layers. To form the electrode layers, a metal paste, for example, a silver-palladium paste or else a copper-containing paste, may be applied to the sheets in a screen printing process. The sheets are subsequently stacked, for example, along a longitudinal axis, pressed and sintered at one and the same time. In this case, an electrode layer does not have to be applied to every piezoelectric layer. For example, there may be several piezoelectric layers between two electrode layers.

The piezoelectric layers are polarized, so that, when a voltage is applied between adjacent electrode layers, they expand along their direction of polarization. For the electrical contacting of the electrode layers, they are connected to outer electrodes. For example, two outer electrodes are attached on two outer sides of the stack. The electrode layers may then be led in an alternating manner along the stacking direction to one of the outer electrodes and electrically connected to it and set back from the second outer electrode. In this way, the electrode layers of one polarity can be electrically contacted by way of a common outer electrode.

For dependable electrical contacting, the outer electrode must be reliably fastened to the outer side of the stack. The outer electrode is fastened to the stack by means of a bonding layer applied by thermal spraying.

This type of fastening has the advantage that, when the outer electrode is fastened to the stack, the piezo ceramic is not heated to such a degree that the stack suffers detrimental effects. Although locally higher temperatures may occur on the outer side of the stack, for example, in the range from 100° C. to 200° C., the temperature increase does not affect the entire volume of the stack and only occurs for a short time. Moreover, the bonding layer applied by thermal spraying preferably lies closely against the outer electrode and the stack and has a small thickness. This makes particularly space-saving contacting of the piezoelectric actuator possible.

The bonding layer bonds at least partially to the outer electrode and to the piezo stack and consequently fastens the outer electrode to the stack. Preferably, the bonding layer bonds at least partially to the upper side of the outer electrode and the outer side of the stack.

The upper side of the outer electrode is in this case that side of the outer electrode that is directly accessible from the outside when an outer electrode is placed on the stack. This includes the regions of the outer electrode that are arranged parallel to the outer side of the stack and can be seen well from the outside. However, the term "upper side" also covers those regions of the outer electrode that are directly accessible from the outside but cannot be seen as well from the outside, since they are inclined with respect to the outer side of the stack. These are, for example, regions at the outer periphery of the outer electrode or regions of the outer electrode that bound holes in the outer electrode. For example, the bonding layer covers the upper side of the outer electrode.

Correspondingly, the bonding layer preferably bonds at least partially at the regions of the outer side of the stack that are directly accessible from the outside when the outer electrode is placed on, i.e., are not concealed by the outer electrode. These are, for example, regions of the outer side of the stack that are arranged around the outer electrode, or regions that can be seen from the outside through clearances in the outer electrode.

Preferably, the bonding layer does not extend into a region between the outer side of the stack and the outer electrode that is not directly accessible from the outside. This concerns, for example, regions in which the outer electrode covers the outer side of the stack and is consequently obscured from the outside. In these regions, the outer electrode is consequently not firmly connected to the stack. This has the advantage that cracks occurring on the outer side of the stack can be bridged by the outer electrode and do not continue into the outer electrode. However, the outer electrode lies at least partially directly against the outer side of the stack and is also in electrical contact with the outer side of the stack. In this case it is possible to contact the electrode layers directly by way of the outer electrode. Contacting of the electrode layers is consequently also possible in the case of a bonding layer of low or no electrical conductivity.

The regions of the outer electrode and of the stack that are in direct mechanical contact with the bonding layer are mainly determined by the thermal spraying method that is used. This comprises first providing a stack of piezoelectric layers and electrode layers arranged in between and placing an outer electrode onto an outer side of the stack. Subsequently, a material is thermally sprayed onto the component. Here, preferably only the partial regions of the outer electrode and of the stack that are directly accessible to the spray particles from the outside, i.e., from the spraying-in direction, are covered by the bonding layer.

In an embodiment, a contact layer for the electrical contacting of the electrode layers is arranged on the outer side of the stack. The outer electrode is fastened to this contact layer. Preferably, the outer electrode at least partially lies directly on the contact layer.

For example, the contact layer is a base metallization, which is fired in at the same time as the stack is sintered. It may also consist of the same material as the electrode layers, for example, of a silver-palladium paste or a copper-containing paste. The contact layer is in this case fastened to the outer side of the stack in the region of a so-called inactive zone, in which every second electrode layer along the stacking direction is led out to the outer side of the stack and in electrical contact with the contact layer. For example, on two opposite sides of the stack contact layers are arranged in the region of inactive zones.

Preferably, the bonding layer is electrically conductive.

This has the advantage that the electrical contacting of the electrode layers is also made possible by way of the bonding layer and not only by way of the outer electrode. Consequently, electrical contacting of the electrode layers is also ensured when the bonding layer reaches into the region between the outer electrode and the stack and is in electrical contact with the contact layer or the electrode layers. Moreover, the voltage supply to the electrode layers can also take place through a further contacting bond fastened to the bonding layer. For example, for this purpose a lead in the form of a wire is soldered onto the bonding layer.

For example, the bonding layer contains a metal.

The metal is preferably chosen such that the bonding layer bonds well on a base metallization and a metallic outer electrode and can produce a reliable electrical connection. For example, the bonding layer contains the same material as the base metallization or as the outer electrode. The metal of the bonding layer is, for example, chosen from the group comprising copper, silver, aluminum and tin.

In an embodiment, the outer electrode is a woven wire fabric that has holes.

The woven wire fabric is, for example, a steel woven wire fabric, a copper woven wire fabric or a woven fabric of an iron-nickel alloy. The wires may also be coated with copper, whereby the solderability of the outer electrode can be improved. For example, this allows an electrical connection for applying an electrical voltage to be soldered onto the outer electrode particularly well.

The woven wire fabric may also be of a multilayer design. In this case, the probability of the outer electrode being torn through completely is reduced, so that the electrical contacting is particularly reliable.

In a further embodiment, the outer electrode is formed as a metal sheet provided with holes.

For example, the metal sheet contains steel, copper or an iron-nickel alloy. The holes may be introduced into the metal sheet by punching.

Outer electrodes of this type that have holes can be fastened to the stack particularly well. During the thermal spraying, the bonding layer is applied to the upper side of the outer electrode and to the stack from the outside. The outer electrode is in this case fastened to the stack particularly reliably if the bonding layer bonds on as many regions as possible of the outer electrode and of the stack at the same time. Preferably, as many locations as possible at which the bonding layer bonds to the stack are close to locations at which the bonding layer bonds to the outer electrode.

Preferably, the holes are distributed uniformly over the outer electrode, so that the electrode can be connected to the stack at as many locations as possible.

Preferably, the holes are filled with the bonding layer.

For example, the outer side of the stack is covered by the bonding layer in the region of the holes. In this case, the bonding layer does not necessarily have to fill the holes completely. It is sufficient if the holes are partially filled by the bonding layer.

Furthermore, a method for fastening an outer electrode in a piezoelectric actuator is specified. In this method, first a stack of piezoelectric layers and electrode layers arranged in between is provided. Subsequently, an outer electrode is placed onto an outer side of the stack. After that, a material is applied to parts of the upper side of the outer electrode and parts of the outer side of the stack. Preferably, the material is thermally sprayed on and thereby brought into particle form.

Preferably, the stack of piezoelectric layers and electrode layers arranged in between is sintered before the outer electrode is applied onto the outer side. For example, during the sintering, a contact layer is at the same time incorporated on the outer side of the stack onto which the outer electrode is applied.

The material is sprayed on in such a way that the outer electrode is firmly connected to the stack. The material that is thermally sprayed on forms a bonding layer, which bonds at least partially on the outer side of the outer electrode and on the outer side of the stack.

For example, a method chosen from the group comprising flame spraying, plasma spraying, cold-gas spraying and arc spraying is chosen for the thermal spraying-on.

In the case of these methods, the material is brought into particle form, accelerated and propelled onto the surface of the outer electrode and of the piezo stack. When they impinge on the surface of the component, the spray particles may be mechanically deformed and remain bonded to the surface. The methods thereby differ, in particular, in the temperature and speed of the particles.

For example, in the case of flame spraying, the material is made to melt, or begin melting, by heating, brought into particle form and propelled onto the surface of the component. In the case of cold-gas spraying, powdered material is used; it is only slightly heated and is propelled at high speed onto the surface to be coated. When the material impinges on the surface, the particles bond to one another and to the surface as a result of the frictional heat that is produced. The thermal spraying methods have the advantage that the stack does not have to be heated, or only slightly, during the spraying-on operation, and consequently there are no or only minor detrimental thermal effects on the stack.

Preferably, the temperature of the stack during the thermal spraying-on lies below the melting temperature of the material that forms the bonding layer.

For example, the temperature of the stack is less than 200° C.

At the same time, it is also included that for a short time locally higher temperatures prevail on the outer side of the stack. However, these temperatures do not concern the entire volume of the stack or the entire outer side of the stack.

BRIEF DESCRIPTION OF THE DRAWINGS

The specified piezoelectric actuator and advantageous configurations thereof are explained below on the basis of schematic figures that are not to scale and in which:

FIG. 1 shows a plan view of a piezoelectric actuator with an outer electrode and a bonding layer;

FIG. 2 shows a cross section of a piezoelectric actuator with an outer electrode and a bonding layer according to FIG. 1.

Figure 3A:
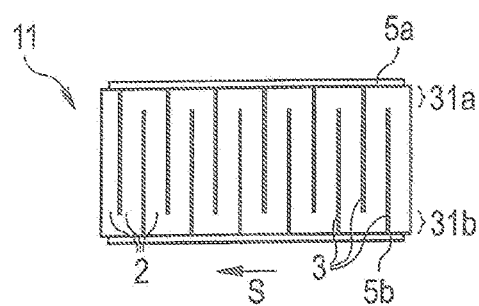
FIGS. 3A to 3D show a method for fastening an outer electrode in a piezoelectric actuator.

The following list of reference symbols may be used in conjunction with the drawings:
1 pieozoelectric actuator
81 soldered joint
11 stack
2 piezoelectric layer
3 electrode layer
31a, 31b inactive zone
4, 4a, 4b bonding layer
41 material
5a, 5b contact layer
6, 6a, 6b outer electrode
63 holes
8 lead

DETAILED DESCRIPTION OF ILLUSTRATIVE EMBODIMENTS

FIG. 1 shows a piezoelectric actuator 1 with a stack 11 of piezoelectric layers (not represented here) and electrode layers (not represented here), which are arranged one above the other along a stacking direction S, which corresponds to the longitudinal axis of the stack 11. The piezoelectric layers and the electrode layers lying in between are sintered at one and the same time and form a monolithic sintered body. For the contacting of the electrode layers, outer electrodes 6 are attached on two opposite side faces. In FIG. 1, the plan view of a side face to which an outer electrode 6 is fastened is represented. On the outer side of the stack 11, a contact layer is applied in the form of a base metallization (cannot be seen here), in order to make better electrical contacting of the electrode layers and more reliable connection of the outer electrode 6 possible.

The outer electrode 6 may be designed in the form of a wire fabric and fastened to the stack 11 by means of a bonding layer 4 applied by thermal spraying. The outer electrode 6 is covered by the bonding layer 4. In FIG. 1, the outline of the outer electrode 6 under the bonding layer 4 is therefore only indicated by dashed lines. The bonding layer 4 bonds to the upper side of the outer electrode 6, that is to say on the side of the outer electrode 6 that is facing away from the stack 11. This also comprises lateral regions of the outer electrode 6. Moreover, the bonding layer 4 also bonds to regions of the contact layer. In this exemplary embodiment, the outer electrode 6 is made to extend beyond the stack 11 and is connected to a lead 8 for supplying voltage. The lead 8 is fastened to the outer electrode 6 by a soldered joint 81. The connection of the lead 8 may also be made, for example, by welding. The outer electrode 6 does not have to reach beyond the stack 11, but may also be completely covered by the bonding layer 4. In this case, a lead 8 may also be fastened directly to the bonding layer 4.

FIG. 2 shows a cross section of the piezoelectric actuator 1 from FIG. 1. A plan view of a piezoelectric layer 2 can be seen. The stack 11 of piezoelectric layers and electrode layers has two opposing inactive zones 31a, 31b. Within the inactive zones 31a, 31b there is no overlapping of adjacent electrode layers of unlike poles, since the electrode layers are led in an alternating manner to the outer side of the piezoelectric actuator and are set back from the opposite outer side. On the outer sides of the stack, contact layers 5a, 5b have been applied, and outer electrodes 6a, 6b fastened on top. The outer electrodes 6a, 6b lie directly on the contact layers 5a, 5b. The electrode layers are electrically contacted alternately by an outer electrode 6a, 6b applied to the outer side of the piezoelectric actuator 1.

The outer electrodes 6a, 6b are designed in the form of wire fabrics in which metal wires are interwoven. Between the wires there are holes 63 in the outer electrode 6a, 6b. The bonding layer 4a, 4b bonds on parts of the upper side of the outer electrode 6a, 6b and parts of the outer side of the stack 11 and also reaches into the holes 63 in the outer electrode 6a, 6b. Consequently, the bonding layer 4a, 4b bonds to the contact layer 5a, 5b on the outer side of the stack 11 in the region of the holes 63 and around the outer electrode 6a, 6b. The bonding layer 4a, 4b also bonds to the upper side of the outer electrode 6a, 6b, in particular, also at lateral regions of the wires of the outer electrode 6a, 6b. These lateral regions are, for example, the regions that surround the holes 63 in the outer electrode 6a, 6b, as well as peripheral regions of the outer electrode 6a, 6b. On the other hand, the bonding layer 4a, 4b does not extend under the outer electrode 6a, 6b, i.e., there is no bonding layer 4a, 4b directly between the outer side of the stack 11 and the outer electrode 6a, 6b.

In FIGS. 3A to 3D, the method for fastening an outer electrode 6a in a piezoelectric actuator 1 is schematically represented in diagrams. In FIG. 3A, a stack 11 of piezoelectric layers 2 and electrode layers 3 arranged in between is provided. The piezoelectric layers 2 are, for example, piezo ceramic layers. It is not necessary in this case for electrode layers 3 to be arranged between all the piezoelectric layers 2. The electrode layers 3 are led out in an alternating manner along the stacking direction S to an outer side of the stack 11 and set back from the other outer side. This has the effect of forming inactive zones 31a, 31b, in which electrode layers 3 of different polarity that are adjacent in the stacking direction S do not overlap. The stack 11 represented has been sintered and has contact layers 5a, 5b, which are connected to the stack 11 likewise by sintering.

Figure 3B:
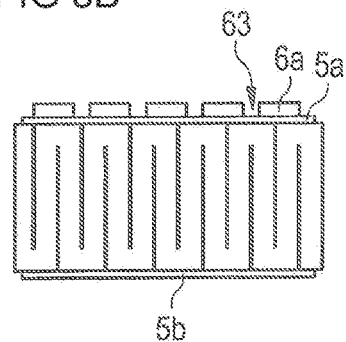

In FIG. 3B, an outer electrode 6a is placed onto a contact layer 5a on the outer side of the stack 11. The outer electrode 6a is a woven wire fabric or metal sheet provided with holes 63.

Figure 3C:
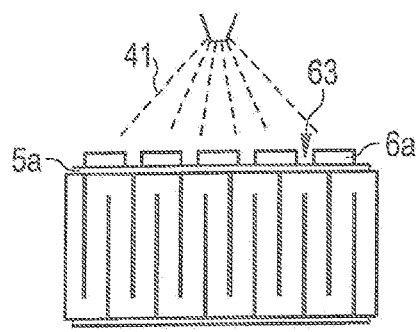

In FIG. 3C, a metallic material 41 is sprayed onto parts of the upper side of the outer electrode 6a and parts of the outer side of the contact layer 5a. The material 41 is in this case in particle form. It impinges on the contact layer 5a and the outer electrode 6a at high speed, so that, on impact, the particles bond to one another and form a bonding layer 4a. The material 41 also penetrates into the holes 63 in the outer electrode 6a.

During the spraying-on operation, the temperature of the material 41 may lie above the melting temperature of the material 41. However, it is also possible that the temperature of the material 41 lies below the melting temperature and that, when they impact on the component, the particles of the material 41 bond to one another and to the component as a result of the frictional heat that is produced.

Figure 3D:
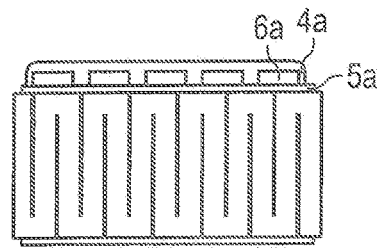

In FIG. 3D, the state at the end of the spraying-on operation is represented. The outer electrode 6a is covered by the bonding layer 4a, this bonding layer 4a also reaching into the holes 63 in the outer electrode. Inside these holes 63 and around the outer electrode 6a, the bonding layer is in direct mechanical contact with the contact layer 5a. Otherwise, the bonding layer 4a is in direct contact with the upper side of the outer electrode 6a.

In order to apply an outer electrode 6b likewise to the opposite outer side of the stack 11, the stack 11 is turned around and FIGS. 3A to 3C of the method are carried out once again.

The invention is not restricted by the description on the basis of exemplary embodiments to these embodiments but comprises each novel feature and any combination of features. This includes, in particular, any combination of features in the patent claims, even if this feature or this combination itself is not explicitly specified in the patent claims or exemplary embodiments.

What is claimed is:

1. A method of forming a piezoelectric actuator, comprising:
   providing a stack having piezoelectric layers and electrode layers arranged between the piezoelectric layers;
   placing an outer electrode onto an outer side of the stack; and
   thermally spraying a material onto parts of an upper side of the outer electrode and the outer side of the stack;
   wherein the material forms a bonding layer on the parts of the outer electrode and outer side of the stack.

2. The method according to claim 1, wherein thermally spraying the material comprises performing a method selected from the group consisting of flame spraying, plasma spraying, cold-gas spraying and arc spraying.

3. The method according to claim 2, wherein a temperature of the stack during the thermal spraying is below a melting temperature of the material.

4. The method according to claim 3, wherein the temperature of the stack is less than 200° C. during the thermally spraying the material.

5. The method according to claim 4, wherein the thermally spraying comprises thermally spraying the material at a temperature and speed that, when the material impinges on a surface of the outer electrode or the stack, particles of the material bond to one another and to the surface to form the bonding layer.

6. The method according to claim 1, wherein the material comprises an electrically conductive material.

7. The method according to claim 6, wherein the material comprises a metal.

8. The method according to claim 7, wherein the metal is selected from the group consisting of copper, silver, aluminum and tin.

9. The method according to claim 1, wherein the outer electrode comprises holes and wherein thermally spraying the material comprises spraying the material into the holes.

10. The method according to claim 1, further comprising sintering the stack prior to the thermally spraying.

11. The method according to claim 10, wherein all layers of the stack are sintered at one and the same time.

12. The method according to claim 1, wherein the bonding layer extends contiguously from past a first edge of the outer electrode over an upper side of the bonding layer and past a second edge of the outer electrode opposite the first edge;
   wherein the bonding layer extends past a third edge of the outer electrode at a first end of the outer electrode, wherein the third edge is adjacent to the first edge and the second edge; and
   wherein a second end of the outer electrode opposite the first end extends past the bonding layer such a first portion of the outer electrode is free of the bonding layer.

13. The method according to claim 12, further comprising mounting a lead on, and electrically connected to, the outer electrode;
   wherein the lead is fastened to the upper side of the first portion of the outer electrode.

14. The method according to claim 12, further comprising mounting a lead on, and electrically connected to, an outer surface of the bonding layer.

15. The method according to claim 1, further comprising:
   providing a contact layer on the outer side of the stack, the contact layer for electrical contacting the electrode layers; and
   wherein the placing an outer electrode onto an outer side of the stack comprises placing the outer electrode on the contact layer.

16. The method according to claim 1, wherein the bonding layer bonds to the entire upper side of the outer electrode.

17. The method according to claim 1, wherein the outer electrode comprises a wire fabric.

18. A method of forming a piezoelectric actuator, comprising:
   providing a stack comprising piezoelectric layers and electrode layers arranged between the piezoelectric layers;
   providing an outer electrode;
   fastening the outer electrode to the stack by applying a bonding layer by thermal spraying.

19. The method according to claim 18, wherein the outer electrode comprises a wire fabric.

* * * * *